US009989983B2

(12) United States Patent
Landolt

(10) Patent No.: US 9,989,983 B2
(45) Date of Patent: Jun. 5, 2018

(54) CURRENT SOURCE FOR THE DELIVERY OF A FIRST CURRENT AND A SECOND CURRENT

(71) Applicant: Rohde & Schwarz GmbH & Co. KG, Munich (DE)

(72) Inventor: Oliver Landolt, Taufkirchen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days. days.

(21) Appl. No.: 14/939,109

(22) Filed: Nov. 12, 2015

(65) Prior Publication Data

US 2016/0139620 A1 May 19, 2016

(30) Foreign Application Priority Data

Nov. 13, 2014 (DE) ........................ 10 2014 223 152

(51) Int. Cl.
*H03B 1/00* (2006.01)
*G05F 3/16* (2006.01)

(52) U.S. Cl.
CPC ..................................... *G05F 3/16* (2013.01)

(58) Field of Classification Search
CPC ........................................................ G05F 3/16
USPC .... 327/108–112, 427, 434, 437; 326/82, 83, 326/87
See application file for complete search history.

(56) References Cited

U.S. PATENT DOCUMENTS 3,340,404 A 9/1967 Williams et al.
5,341,087 A * 8/1994 Van Leeuwen ......... G05F 1/577 323/315
2011/0150138 A1* 6/2011 Park ..................... H03H 19/004 375/316
2013/0027017 A1* 1/2013 Cheng ..................... G05F 1/561 323/311

FOREIGN PATENT DOCUMENTS

EP 0544360 6/1993
EP 2533128 1/2014

OTHER PUBLICATIONS

The German Search Report dated Jun. 2, 2015 for German Patent Application No. 10 2014 223 152.3, 9 pages.

* cited by examiner

*Primary Examiner* — Thomas Skibinski
(74) *Attorney, Agent, or Firm* — Lee & Hayes, PLLC

(57) ABSTRACT

The invention relates to a current source for the delivery of a first current and a second current, wherein the first current is biased opposite to the second current. The current source provides a first transistor, wherein the first transistor is connected with a control terminal to a first control voltage. The current source provides a second transistor, wherein the second transistor is connected with a control terminal to a second control voltage. The source terminal of the first transistor is connected in an electrically conducting manner to the source terminal of the second transistor. The first current is delivered at the drain terminal of the first transistor, and the second current is delivered at the drain terminal of the second transistor. Furthermore, a circuit arrangement with a current source according to the invention is provided according to the invention.

7 Claims, 3 Drawing Sheets

CURRENT SOURCE FOR THE DELIVERY OF A FIRST CURRENT AND A SECOND CURRENT

PRIORITY

This application claims priority of German patent application DE 10 2014 223 152.3 filed on Nov. 13, 2014 which is incorporated by reference herewith.

FIELD OF THE INVENTION

The invention relates to a current source for the delivery of a first current and a second current and a circuit arrangement with this current source.

BACKGROUND OF THE INVENTION

There are circuit arrangements in which current sources are used in order to register accurately an input signal applied to the circuit arrangement. In this context, a current source generates two electrical currents with opposite bias, so that, within the circuit arrangement, a first current source and a second current source, designated in the following as the current sink, with opposite bias to the first current source, are introduced into the circuit arrangement.

Such a circuit arrangement is, for example, a so-called common-gate amplifier in which the control terminal of an input transistor is regulated to a reference potential. In order to ensure that such circuit arrangements are used correctly at their operating point, it is necessary to introduce into the circuit arrangement an ideal current source and an ideal current sink with opposite bias to the current source, so that the current generated in the current source is completely absorbed in the current sink, so that a total current from the current source and the current sink ideally provides a magnitude of exactly zero amperes. In this manner, an input signal to be registered by the circuit arrangement, for example, an input current, is not registered with a falsification resulting from an unmatched error signal, for example, an error current.

If a current generated by the current source is not completely absorbed by the current sink or if the current absorbable by the current sink is greater than the current generated by the current source, a total current is provided, which is not equal to zero amperes, designated in the following as an error current. This error current is added to the input signal. Such mismatch between the current source and the current sink is specially troublesome when generated by time-dependent or temperature-dependent fluctuations of the current sources and have a direct influence on the input signal to be registered.

If a circuit arrangement of this kind is used as an input unit in a measuring instrument operating with high precision, such error currents influence the measurement result of the measuring instrument in such a manner that measurement errors occur. With measuring instruments such as digital storage oscilloscopes or spectrum analysers, the registration of the input signal must be implemented without error over several decades of the measurement amplitude to be registered. Furthermore, the registration should be possible over a large frequency range of the input signal, in particular, it should be possible to register through a circuit arrangement input currents from DC current through to alternating currents of high-frequency.

With the common-gate amplifiers known hitherto, the current flowing through the input transistor must therefore be substantially larger than the maximum input current to be registered. However, applications are conceivable in which an input current to be registered is much smaller than the current through the transistor. Such input currents can be registered only inaccurately with circuit arrangements of this kind.

Regardless of the occurrence of error currents resulting from a current source or respectively current sink embodied in a non-ideal manner, it is necessary to deliver a circuit arrangement which provides a low noise behaviour. Because of the use of two different current sources in the circuit arrangement, the addition of additional noise cannot be prevented. Through the use of a first current source separate from a second current source operated as a current sink, two different noise sources are introduced into the circuit arrangement, wherein the two noise sources are not correlated with one another. Accordingly, these two noise sources are statistically independent of one another and impair the signal-noise ratio of the circuit arrangement independently of one another.

Current mirrors for the generation of current sources are known, for example, from EP 2 533 128 B1, wherein the current sources can also always be used as current sinks. In this context, a reference current is used, which is duplicated by two output current mirrors. These output current mirrors are built up, for example with n-channel-field effect transistors. The current generated from one of the output current mirrors is supplied to a further current mirror made up from p-channel field effect transistors.

The generated currents of the p-channel or respectively n-channel current mirror are then identical to one another if all of the transistors used have the same dimensions and are perfectly matched with one another. With the use of current mirrors as current sources or respectively current sinks, it should be noted that the source-drain conductance is very low in order to avoid errors caused by different drain-source voltages (abbreviation $V_{DS}$). Such current sources can also be constructed from cascoded transistors or control elements in order to adapt the drain-source voltages of critically matched transistor pairs.

These current sources have an accuracy up to one percent, that is to say, the currents are generated with a maximal accuracy of one percent. Such an accuracy is too low for the input units of measuring instruments. In order to achieve an improvement in accuracy, calibration circuits must be provided to match the current sink to the current source. With such a calibration circuit, it must also be taken into account that the transistors to be calibrated are strongly temperature dependent, so that it is almost impossible to find an appropriate calibration which applies across a wide temperature range.

Furthermore, with current sources and current sinks constructed by means of current mirror circuits, it is almost impossible to obtain a low noise factor. Since different current sources in a circuit arrangement are delivered by different current mirrors, each of the current sources forms a statistically independent noise source which further impairs the signal-noise ratio of an input signal.

One object of the present invention among others is therefore to deliver a high-precision current source and a circuit arrangement with this current source, which can generate a large number of currents and is low in noise.

SUMMARY OF THE INVENTION

According to one aspect of the present invention, a current source is provided for the delivery of a first current and a second current. The first current is biased opposite to the second current. The current source provides a first transistor, wherein the first transistor is connected with a control terminal to a first control voltage. The current source provides a second transistor, wherein the second transistor is connected with a control terminal to a second control voltage. The source terminal of the first transistor is connected in an electrically conducting manner to the source terminal of the second transistor. The first current is delivered at the drain terminal of the first transistor, while the second current is delivered at the drain terminal of the second transistor.

Through the use of a first control voltage and a second control voltage whose difference is not equal to zero, the first current and also the second current are adjusted and delivered on an identical current path. Since neither the first current nor the second current provides current drains outside this current path, and the applied control voltages bias the respective transistor, a source voltage is adjusted which achieves a high-precision matching of the first current and the second current.

Preferably, the source terminal can be a source terminal of a field-effect transistor or respectively an emitter terminal of a bipolar transistor. The drain terminal can be, in particular, a drain terminal of a field-effect transistor or respectively a collector terminal of a bipolar transistor. The control terminal can be, in particular, a gate terminal of a field effect transistor or respectively a base terminal of a bipolar transistor.

Preferably the amplitude of the current which flows through the respective source terminals of the transistors depends upon the voltage difference between the first control voltage and the second control voltage. If the first control voltage and/or the second control voltage vary because of temperature influences or noise, the current through the source terminals will in fact also vary, however, as a result of the opposite bias of the first current relative to the second current, each of the fluctuations will act in an opposite manner on the two currents. If the first current and the second current are used in a circuit arrangement, the fluctuations are completely cancelled out. The same applies for the intrinsic noise, for example, the flicker noise of the transistors used. This noise in fact also leads to current fluctuations, however, the noise of the first current is correlated with the noise of the second current, so that the noise factor of the current source is substantially lower, as if separate current sources were used for each of the currents.

In a preferred embodiment, the first transistor is an n-channel transistor and the second transistor is a p-channel transistor. In this manner, the opposite bias between a first current and a second current is achieved in a simple manner. In the case of bipolar transistors, the first transistor is preferably an npn-bipolar transistor, and the second transistor is a pnp-transistor.

In a preferred embodiment, a floating voltage source is arranged between the source terminal of the first transistor and the source terminal of the second transistor. A first terminal of the floating voltage source is connected to the source terminal of the first transistor. A second terminal of the floating voltage source is connected in an electrically conducting manner to the source terminal of the second transistor. In this manner, the voltage range at the drain terminal of the transistors is enlarged.

In this context, the floating voltage source is introduced into the current source in such a manner that the p-channel transistor operates with a higher voltage than the n-channel transistor. Accordingly, this floating voltage source reduces the minimal operating voltage at the current sink and increases the maximal operating voltage in the current source.

In a preferred embodiment, the first transistor and also the second transistor is a field-effect transistor. With the use of field-effect transistors instead of bipolar transistors, the base current can be ignored, thereby achieving a simplified construction of the current source.

In particular, field-effect transistors with metal oxide layer, abbreviation MOS-FET, should be used by preference.

In a preferred embodiment, the first current is nominally identical in magnitude to the second current. The first current is picked up especially at the first drain terminal of the first transistor. The second current is picked up especially at the second drain terminal of the second transistor. Accordingly, nominal value differences are avoided, thereby achieving a versatile range of uses for the current source. With the use of circuit arrangements of the type described above, it is sometimes necessary for the first current and the second current to provide an exactly identical nominal value, so that a more versatile use of the current source is possible with such an embodiment.

By comparison with the second transistor, the first transistor is preferably dimensioned such that, with the application of a nominally identical control voltage to the first transistor or respectively to the second transistor, an identical current flows through the respective transistor.

In a preferred embodiment, an ohmic source resistor is arranged between the source terminal of the first transistor and the source terminal of the second transistor. A source resistor is understood to be a resistor which is arranged at the source terminal of a transistor. A first terminal of the ohmic source resistor is connected to the source terminal of the first transistor. A second terminal of the ohmic source resistor is connected to the source terminal of the second transistor.

This embodiment has the advantage that the dependence of the current source upon the parameters of the transistors is reduced. By introducing the ohmic resistor between the source terminals of the transistors, the dependence of the transistor parameters and associated tolerances are substantially reduced.

In a preferred embodiment, a first ohmic source resistor is arranged between the source terminal of the first transistor and the first terminal of the floating voltage source, wherein a first terminal of the first ohmic source resistor is connected to the source terminal of the first transistor, and wherein a second terminal of the first ohmic source resistor is connected to the first terminal of the floating voltage source.

In a preferred embodiment, a second ohmic source resistor is arranged between the source terminal of the second transistor and the second terminal of the floating voltage source, wherein a first terminal of the second ohmic source resistor is connected to the source terminal of the second transistor, and wherein a second terminal of the second ohmic source resistor is connected to the second terminal of the floating voltage source.

In this context, the resistance value of the first ohmic source resistor is adjusted to be identical to the resistance value of the second ohmic source resistor. By using these two identical ohmic resistors, disturbing influences can be filtered out as a result of the symmetrical arrangement.

In a preferred embodiment, the first control voltage is delivered through the output of a first operational amplifier, wherein the first operational amplifier is connected with a positive input to a first reference voltage source, and wherein the first operational amplifier is connected with a negative input to the source terminal of the first transistor.

Through the use of an operational amplifier for the delivery of the first control voltage for the first transistor, a further improvement of the current source is achieved in that a dependence upon the transistor parameters is strongly reduced. In particular, the feedback of the source terminal to an input of the operational amplifier, allows a high-precision regulation of the first control voltage.

In a preferred embodiment, the second control voltage is delivered through the output of a second operational amplifier, wherein the second operational amplifier is connected with a positive input to a second reference voltage source, and wherein the second operational amplifier is connected with a negative input to the source terminal of the second transistor. Accordingly, the dependence of the second transistor upon the transistor parameters is also reduced.

Through the use of two operational amplifiers for the adjustment of the first and respectively second control voltage in the respective transistor, a high-precision differential voltage is adjusted between the first control voltage and the second control voltage, thereby obtaining a high-precision current at the respective source terminal of the transistors. Since a single current source is used for the delivery of the first current and also for the delivery of the second current, a high-precision first current and a high-precision second current are obtained, of which the noise factor is less than the noise factor of two separate current sources.

Through the use of the ohmic source resistor between the source terminals, the current to be delivered is substantially identical to the quotient of the difference of the reference voltages and the ohmic resistance.

In particular, a transformer is used for the provision of a floating voltage source. A rectifier and a filter element are connected downstream of the transformer.

Alternatively or additionally, the floating voltage source can also be realised by a battery.

Alternatively or additionally, the floating voltage source can also be provided by a solar cell.

Regardless of the actual embodiment of the floating voltage source, it should be noted that the floating voltage source preferably provides no further consumers. In particular, it is provided that the floating voltage source is introduced only between the source terminals of the transistors, and no further branches of the voltage respectively the current of the floating voltage source are present. In this manner, it is possible that the current cannot drain between the two source terminals of the transistors.

According to another aspect of the invention, a circuit arrangement is further provided, which comprises an input terminal for the application of an input voltage. Furthermore, an ohmic resistor is provided in the circuit arrangement, which is connected with a first terminal to the measurement input. A transistor is provided, which is connected with a source terminal to a second terminal of the ohmic resistor. In the circuit arrangement, an output terminal is further provided for picking up an output voltage, wherein the output terminal is connected to the drain terminal of the transistor. Furthermore, a current source of the type described in the introduction is provided, which delivers a first current which is connected to the drain terminal of the transistor, wherein the current source delivers a second current which is connected to the source terminal of the transistor.

Such a circuit arrangement should be provided, preferably, as an input unit in a measuring instrument, for example, a digital storage oscilloscope or spectrum analyser. With this circuit arrangement, a high-precision registration of an input signal is possible. Accordingly, an input voltage or an input current can be registered at the input terminal, which is not registered by error-matched current sources with measurement errors or falsified by high-level additional noise.

A voltage which regulates the source terminal to the reference potential is preferably applied at the control terminal of the transistor.

In a preferred embodiment, the control terminal of the transistor is connected to the output of an operational amplifier, wherein a positive input of the operational amplifier is connected to a reference potential, and wherein a negative input of the operational amplifier is connected to the source terminal of the transistor.

Through these embodiments, the source terminal of the transistor is preferably supplied with a voltage which is identical to the reference voltage, for example, of a virtual ground. In this manner, a measurement signal applied at the input terminal flows only through the ohmic resistor and causes a voltage drop there. Through the use of a high precision current source which delivers a first current and a second current, which are oppositely biased and nominally identical, the transistor is operated in an ideal manner at an operating point. Any error voltages or error currents are avoided. Accordingly, an output signal is delivered at the output of the circuit arrangement, which agrees to a high degree with the input signal or respectively is ideally identical to the input signal. Through the use of the current source according to the invention in the circuit arrangement, a current drain resulting from error matching is not possible, so that the current is therefore transported from the input to the output of the circuit arrangement.

BRIEF DESCRIPTION OF THE DRAWINGS

In the following, the invention and its advantages are explained in greater detail with reference to exemplary embodiments by way of example only. In this context, the exemplary embodiments are illustrated with reference to exemplary Figures Identical elements in the Figures are provided with identical reference numbers. Accordingly, in some cases, the exemplary embodiments are illustrated in a simplified manner in order to explain the essence of the invention more closely.

The Figures of the drawings show.

DETAILED DESCRIPTION OF THE DRAWINGS

Figure 1:
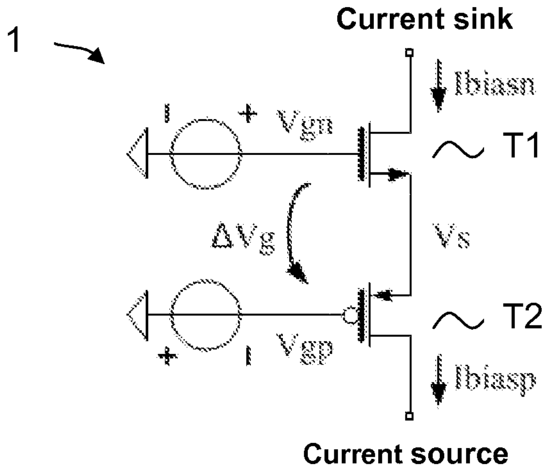
FIG. 1 a first exemplary embodiment of a current source according to the invention.

FIG. 1 shows a current source 1 according to the invention with reference to a first exemplary embodiment. The current source 1 provides a first transistor T1. The first transistor T1 is connected with a control terminal to a first control voltage $V_{gn}$. The current source 1 further provides a second transistor T2, wherein the second transistor T2 is connected with a control terminal to a second control voltage $V_{gp}$. The source terminal of the first transistor T1 is connected in an electrically conducting manner to the source terminal of the second transistor T2. The first current $I_{biasn}$ is delivered at the drain terminal of the first transistor T1. The second current $I_{biasp}$ is delivered at the drain terminal of the second transistor T2.

The first transistor T1 represents a current sink, and the second transistor T2 represents a current source. A current sink of the type according to the invention is a current source with opposite bias. In this exemplary embodiment, the first transistor T1 is an n-channel-field-effect transistor, and the second transistor T2 is a p-channel-field-effect transistor.

As a result of the connecting together according to the invention of the source terminal of the first transistor T1 with the source terminal of the second transistor T2, an identical nominal value of the first current $I_{biasn}$ relative to the second current $I_{biasp}$ is achieved. A draining of the first current $I_{biasn}$ or respectively of the second current $I_{biasp}$ is not possible in the current source 1 according to the invention.

The control terminal of the first transistor T1 and the control terminal of the second transistor T2 are biased via a first control voltage $V_{gn}$ and respectively a second control voltage $V_{gp}$ in such a manner that a source voltage $V_s$ is adjusted between the source terminal of the first transistor T1 and the source terminal of the second transistor T2. The currents within the respective transistors T1 and T2 are identical.

The amplitude of the first current $I_{biasn}$ and respectively of the second current $I_{biasp}$ in this context is dependent only on the voltage difference $\Delta V_g$ of the control terminals of the transistors T1 and T2. The voltage difference $\Delta V_g$ in this context is adjusted between the control terminal of the first transistor T1 and the control terminal of the second transistor T2. If a voltage fluctuation resulting from temperature changes or noise is now caused at one of the control terminals of the first transistor T1 or the second transistor T2, the current of the transistors T1 and T2 is also varied.

However, according to the invention, the first current $I_{biasn}$ and also the second current $I_{biasp}$ are varied to the same extent in this context. The nominal value of the first current $I_{biasn}$ and of the second current $I_{biasp}$ accordingly remains identical in every case. In the exemplary embodiment according to FIG. 1, the magnitude of the first current $I_{biasn}$ is identical to the magnitude of the second current $I_{biasp}$.

The previous statements regarding the current apply so long as no leakage current relative to the reference potential is drained. Especially in the case of high-frequency input signals, a draining, for example, as a result of parasitic capacitances, cannot be completely prevented. Since the draining from current components resulting from parasitic capacitances is negligibly small, the magnitude of the first current $I_{biasn}$ can be set to the same value as the magnitude of the second current $I_{biasp}$.

With very high frequencies, especially above 10 GHz, the influence of the signal delay time of the current increases as a result of the connection between the source terminal of the first transistor T1 and the source terminal of the second transistor T2 and the signal delay time of the channel current within the first transistor T1 and the second transistor T2.

The transistors T1 and T2 are subject to flicker noise. This noise generation resulting from the intrinsic noise source contained in each case in the first transistor T1 and the second transistor T2 and the differences occurring as a result of the signal delay time at very high frequencies can lead to a minimal deviation of the magnitude between the first current $I_{biasn}$ and the second current $I_{biasp}$.

The first current $I_{biasn}$ and the second current $I_{biasp}$ are not only dependent upon the voltage difference $\Delta V_g$ of the control terminals, but also upon the threshold voltage and other parameters of the first transistor T1 and the second transistor T2. The transistor parameters possibly vary with use in different semiconductor circuits. This dependence is resolved through a second exemplary embodiment as shown in FIG. 2.

Figure 2:
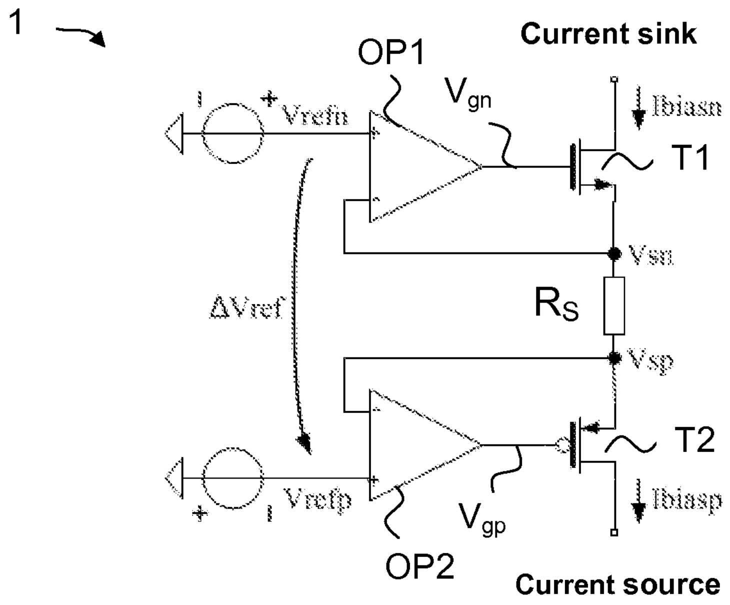
FIG. 2 a second exemplary embodiment of a current source according to the invention.

FIG. 2 shows a second exemplary embodiment of the invention. In addition to the first transistor T1 and the second transistor T2, an ohmic source resistor $R_s$ is provided in the current source 1. The ohmic source resistor $R_s$ is connected with its first terminal to the source terminal of the first transistor T1. The ohmic source resistor $R_s$ is connected with its second terminal to a source terminal of the second transistor T2. Through the introduction of the source resistor $R_s$, the dependence upon the transistor parameters is reduced. Furthermore, a first operational amplifier OP1 is provided in FIG. 2. An output of the first operational amplifier OP1 is connected to the control terminal of the first transistor T1. Via the output of the operational amplifier OP1, the first control voltage $V_{gn}$ is connected to the first transistor T1. The first operational amplifier OP1 is connected with its positive input to a first reference voltage source $V_{refn}$. The negative input of the first operational amplifier OP1 is connected to the source terminal of the first transistor T1. At the negative input of the first operational amplifier OP1, the voltage $V_{sn}$ can be picked up as a first voltage at the drain terminal of the first transistor T1.

Furthermore, a second operational amplifier OP2 is provided in the current source 1 according to FIG. 2, which is arranged identically relative to the operational amplifier OP1 with the second transistor T2. Instead of the first reference voltage $V_{refn}$ the second reference voltage source $V_{refp}$ is connected to the positive input of the second operational amplifier OP2. The second reference voltage source $V_{refp}$ is biased opposite to the first reference voltage source $V_{refn}$. A voltage difference of the reference voltage sources $\Delta V_{ref}$ is adjusted between the positive input of the first operational amplifier OP1 and the positive input of the second operational amplifier OP2.

Through the use of the operational amplifiers OP1 and OP2, the first control voltage $V_{gn}$ and the second control voltage $V_{gp}$ are regulated so that the voltage decline across the source resistor $R_s$ is equal to the voltage difference of the reference voltage sources $\Delta V_{ref}$.

According to FIG. 2, a channel current which exists through the quotients of the voltage difference $\Delta V_{ref}$ of the reference voltage sources $V_{refn}$, $V_{refp}$ and the ohmic source resistor $R_s$ is adjusted. Alternatively, the resulting current which corresponds to the first current $I_{biasn}$ and the second current $I_{biasp}$, can also be calculated by division of the difference of the voltages $V_{sn}$-$V_{sp}$ and the source resistor $R_s$. Since the first voltage $V_{sn}$ at the transistor drain is equal to the first reference voltage source $V_{refn}$ and respectively the second voltage $V_{sp}$ at the transistor drain is equal to the second reference voltage source $V_{refp}$, the transistor parameters of the first transistor T1 and the second transistor T2 are regulated out, so that a temperature drift and a noise behaviour in the current source 1 according to the invention is reduced.

Figure 3A:
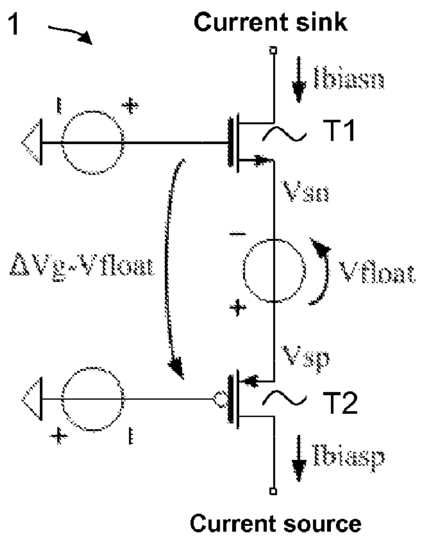
FIG. 3*a* a third exemplary embodiment of a current source according to the invention.

FIG. 3*a* shows a third embodiment of the current source 1 according to the invention. The current source 1 illustrated in FIG. 3*a* can also be designated as an active version of the current source 1 according to the invention. By comparison with the current source 1 according to FIG. 1, the current source 1 according to FIG. 3*a* is fitted with a floating voltage source $V_{float}$. The floating voltage source $V_{float}$ is connected with a first terminal to a source terminal of the first transistor T1. The floating voltage source $V_{float}$ is connected with a second terminal to the source terminal of the second transistor T2. The floating voltage source $V_{float}$ is disposed between the source terminals of the transistors T1 and T2.

Figure 3B:
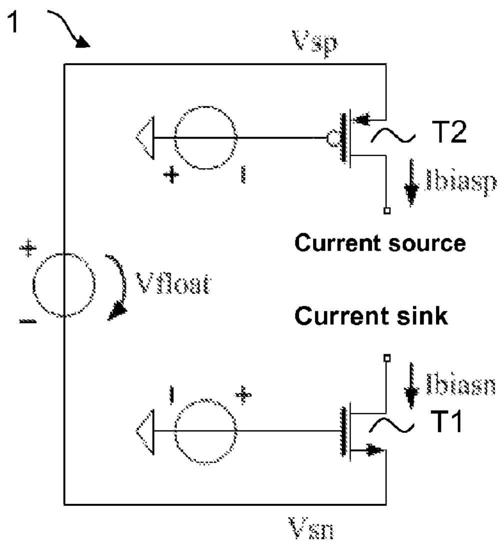
FIG. 3*b* an alternative illustration of the current source according to the invention illustrated in FIG. 3*a;*
Figure 4:
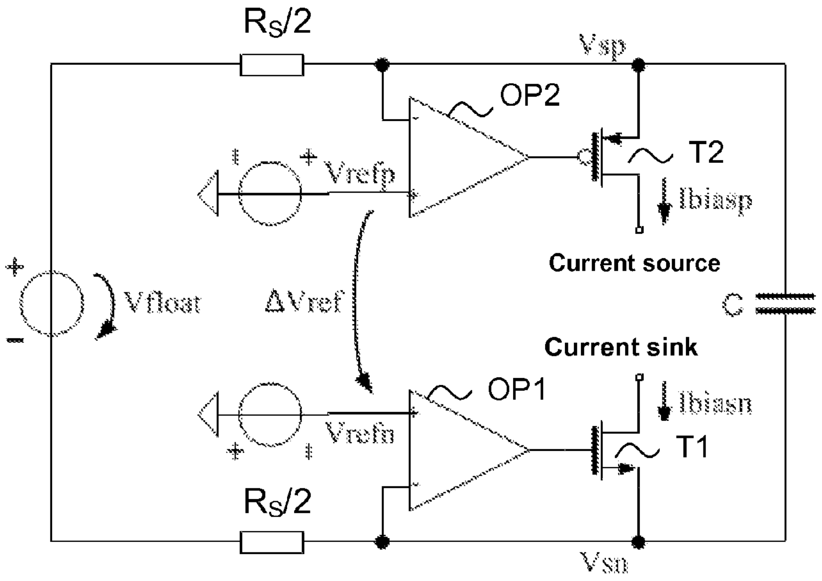
FIG. 4 a fourth exemplary embodiment of a current source according to the invention.

While FIG. 1 and FIG. 2 describe passive versions of the current source 1 according to the invention, FIG. 3*a*, FIG. 3*b* and FIG. 4 each describe an active version of the current source 1 according to the invention. The first transistor T1 and also the second transistor T2 must be biased in order to allow a current flow. In this context, the first transistor T1 must provide a larger voltage at the drain terminal than the source voltage $V_s$. Accordingly, the voltage in the current source 1, which is delivered through the drain terminal of the second transistor T2, should be substantially lower than the source voltage $V_s$. Typical substantial voltage differences should be at least 100 mV.

Now, in order to achieve this voltage difference, a floating voltage source $V_{float}$ is introduced between the source terminals of the first transistor T1 and the second transistor T2. The floating voltage source $V_{float}$ is accordingly introduced into the current source 1 in such a manner that the n-channel-transistor T1 is operated with a lower voltage than the p-channel transistor T2. This floating voltage source $V_{float}$ reduces the operating voltage in the current sink and increases the maximal operating voltage in the current source. To ensure that the first current $I_{biasn}$ and the second current $I_{biasp}$ provide the same nominal value in magnitude, the voltage difference $\Delta V_g$ of the control terminals is reduced by the magnitude of the floating voltage source $V_{float}$.

FIG. 3*b* shows the current source 1 of FIG. 3*a* in an alternative view. The circuit in FIG. 3*b* is largely identical to the circuit in FIG. 3*a*.

It is advantageous that the voltage source $V_{float}$ is a floating voltage source. This means that no current drain is possible via this voltage source $V_{float}$. The floating voltage source $V_{float}$ must be introduced as a genuine voltage source and must actually deliver power. A passive voltage source is not suitable for this purpose. In order to match the first current $I_{biasn}$ and the second current $I_{biasp}$ exactly to one another, the floating voltage source $V_{float}$ must not provide a current path to a reference potential or to other current sinks, in order to obtain nominally identical currents.

A floating voltage source $V_{float}$ should be provided, for example, through the use of a transformer followed by a rectifier and a filter unit. If the voltage source is a DC voltage source, a switched mode power supply is used in order to deliver the energy via the transformer.

The use of a battery as the floating voltage source $V_{float}$ is provided as an alternative. The use of two batteries means that during the discharging of the first battery, the second battery can be charged, thereby avoiding a discharging of only one battery as the floating voltage source $V_{float}$. Alternatively, a charging capacitor can also be used as a floating voltage source $V_{float}$. Alternatively, a combination of light source and solar cell can also be used as a floating voltage source $V_{float}$.

FIG. 4 shows a fourth exemplary embodiment of the current source 1 according to the invention. In the exemplary embodiment according to FIG. 4, the control of the first transistor T1 and the second transistor T2 is improved in the manner described in FIG. 2 through the use of a first operational amplifier OP1 respectively a second operational amplifier OP2. With the use of the operational amplifiers OP1 and OP2, the control voltages for the control terminals of the respective transistors T1 and T2 can be improved. In this manner, adjusted control voltages $V_{sp}$ and $V_{sn}$ are obtained from the reference voltage sources $V_{refn}$, $V_{refp}$.

For further improvement of the current source 1, an ohmic resistor $R_s$ is provided. By contrast with the embodiment shown in FIG. 2, a symmetrical circuit concept is proposed here in order to filter out disturbing influences in an improved manner. For this purpose, the ohmic resistor $R_s$ is subdivided between two ohmic resistors $R_s/2$ of identical size. The first ohmic resistor $R_s/2$ in this context is arranged between the source terminal of the first transistor T1 and the floating voltage source $V_{float}$. Accordingly, the second ohmic source resistor $R_s/2$ is arranged between the source terminal of the second transistor T2 and the second terminal of the floating voltage source $V_{float}$. It should be noted that the floating voltage source $V_{float}$ provides a voltage which is greater than the voltage difference $\Delta V_{ref}$ of the reference voltage sources $V_{refn}$ and $V_{refp}$.

Through the embodiment of the current source 1 according to the invention as shown in FIG. 4, a first current $I_{biasn}$ respectively a second current $I_{biasp}$ is obtained, which is equal to the result from the difference of $V_{float}$ and $\Delta V_{ref}$ divided by the ohmic source resistor $R_s$. In this manner, a dependence of the first current $I_{biasn}$ respectively the second current $I_{biasp}$ upon transistor parameters is largely prevented. Furthermore, a capacitor C which provides a short and a low-impedance path between the two source terminals of the first transistor T1 and the second transistor T2, is introduced according to FIG. 4, so that a noise of the first current $I_{biasn}$ and the second current $I_{biasp}$ is correlated up to high frequencies. In this manner, the signal-noise interval is also improved at high frequencies of an input signal.

A plurality of transistors T1 and T2 is not precluded according to the invention. For every branch comprising first transistor T1 and second transistor T2, a separate floating voltage source $V_{float}$ is used.

Figure 5:
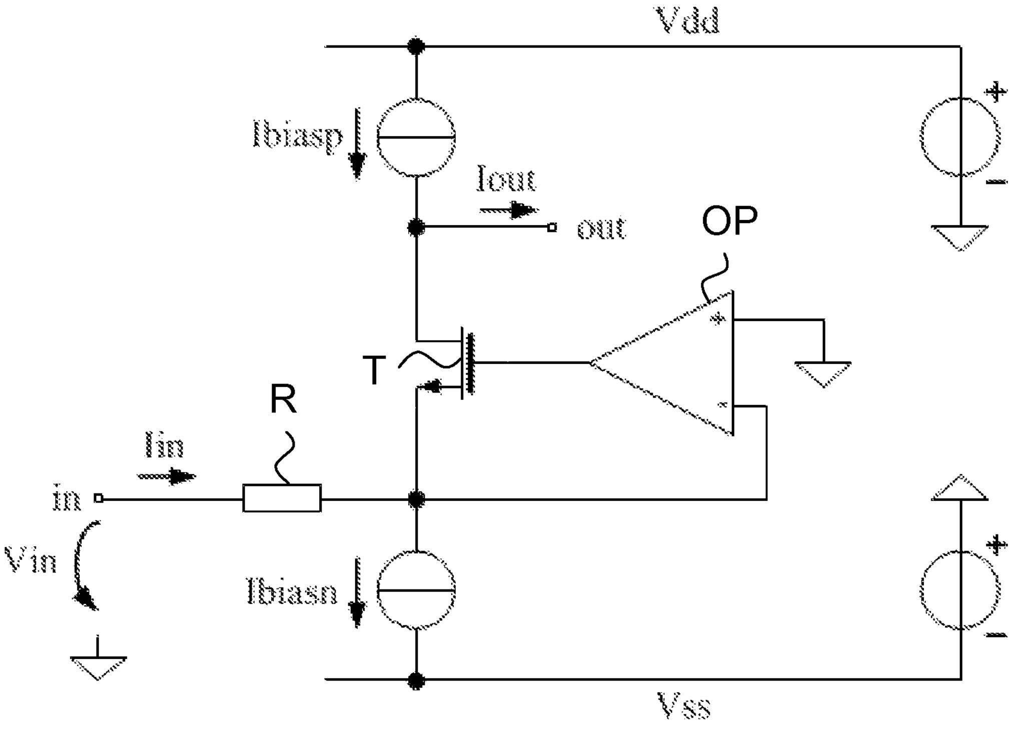
FIG. 5 a circuit arrangement according to the invention with the use of a current source according to the invention.

FIG. 5 shows a circuit arrangement according to the invention, which uses the first current $I_{biasn}$ and second current $I_{biasp}$ generated from the current source 1 in the manner of the invention. The circuit arrangement shown in FIG. 5 is, for example, an input circuit for the registration of an input current $I_{in}$ or an input voltage $V_{in}$ at an input terminal IN. In this context, the input voltage $V_{in}$ can be positive or negative with regard to the reference potential. The voltage $V_{in}$ is applied to the input terminal IN. The input terminal IN is connected to a first terminal of an ohmic resistor R. The second terminal of the ohmic resistor R is connected to a source terminal of a transistor T. The source terminal of the transistor T is connected to the first current $I_{biasn}$ of the current source 1.

The drain terminal of the transistor T is supplied with the second current $I_{biasp}$. The first current $I_{biasn}$ and the second current $I_{biasp}$ are generated by the current source 1 as shown in FIG. 1 to FIG. 4. At the drain terminal of the transistor T, an output terminal OUT is further provided, at which an output current $I_{out}$ or respectively an output voltage $V_{out}$ can be picked up. In the present case, the transistor T is an n-channel-field-effect transistor. The control terminal of the transistor T is connected to the output of operational amplifier OP. The positive input of the operational amplifier OP is connected to the reference potential. The negative input of the operational amplifier OP is connected to the source terminal of the transistor T. Such an arrangement of an operational amplifier OP at a control terminal of the transistor T means that the source terminal of the transistor T is regulated substantially to the reference potential.

Alternative embodiments for regulating a transistor T in order to control the source terminal to the reference potential are not precluded according to the invention.

With a circuit arrangement according to FIG. 5, the source terminal of the transistor T can be regarded as a virtual ground, so that an input current $I_{in}$ can be calculated from the quotient of the applied voltage $V_{in}$ and the ohmic resistance R. The circuit arrangement shown in FIG. 5 is, for example, a current measuring arrangement.

Through the use of a current source 1 according to the invention, a first current $I_{biasn}$ and a second current $I_{biasp}$ is also generated for the circuit arrangement according to FIG. 5, which are in fact in principle oppositely biased, but are nominally identical in magnitude.

To ensure that the transistor T is biased in the forward direction, a given current must flow from the drain terminal to the source terminal of the transistor T, wherein the level of the input voltage $V_{in}$ applied must be independent of this. In order to achieve this, a first current source $I_{biasn}$ is required which is superposed on the input current $I_{in}$ to be measured. To ensure that no signal falsification occurs, an opposing current $I_{biasp}$ must also be generated, in order, once again, to remove the volume of current required for the biasing of the transistor T. The use of two currents $I_{biasn}$ and $I_{biasp}$, which are nominally identical, means that the input current $I_{in}$ is identical to the output current $I_{out}$.

As a result of the use of a current source according to the invention, as shown in FIG. 1 to FIG. 4, the circuit arrangement shown in FIG. 5 is temperature stable with low noise over a wide range. A use of input currents $I_{in}$ with amplitudes over several decades is unproblematic in this context. The circuit arrangement according to FIG. 5 can be operated with input currents $I_{in}$ with a frequency from DC current up to very high frequencies, without a significant measurement error being added to the input current $I_{in}$.

Within the scope of the invention, all of the elements described and/or illustrated and/or claimed can be combined arbitrarily with one another. In particular, embodiments of the passive version of the current source 1 can be combined with embodiments of the active version of the current source 1.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

I claim:

1. A circuit arrangement comprising:

an input terminal for an application of an input signal;

an ohmic resistor, which is connected with a first terminal of the ohmic resister to the input terminal;

a third transistor, which is connected with a source terminal of the third transistor to a second terminal of the ohmic resistor; and an output terminal for picking up an output signal, wherein the output terminal is connected to a drain terminal of the third transistor;

a current source for delivery of a first current and a second current, wherein the first current flows opposite to the second current, comprising:

a first transistor, wherein the first transistor is connected with a first control terminal to a first control voltage, a second transistor, wherein the second transistor is connected with a second control terminal to a second control voltage, wherein a source terminal of the first transistor is connected in an electrically conducting manner to a source terminal of the second transistor, wherein the first current is delivered at a drain terminal of the first transistor, and the second current is delivered at a drain terminal of the second transistor, and wherein a temperature drift of the current source is reduced and a noise behavior of the current source is reduced based at least in part on regulating out one or more transistor parameters of the first transistor and the second transistor, wherein the first transistor and the second transistor are configured to provide identical current flows through a respective transistor by applying a nominally identical control voltage to a control node of the first transistor or respectively to a control node of the second transistor;

wherein the first current is fed in at the drain terminal of the third transistor, and wherein the second current is fed in at the source terminal of the third transistor.

2. The circuit arrangement according to claim 1, wherein the first transistor is an n-channel-FET-transistor, and wherein the second transistor is a p-channel-FET-transistor or wherein the first transistor is an npn-bipolar transistor, and the second transistor is a pnp-bipolar transistor.

3. The circuit arrangement according to claim 1, wherein an ohmic source resistor is arranged between the source terminal of the first transistor and the source terminal of the second transistor, wherein a first terminal of the ohmic source resistor is connected to the source terminal of the first transistor, and wherein a second terminal of the ohmic source resistor is connected to the source terminal of the second transistor.

4. The circuit arrangement according to claim 1, wherein the first control voltage is delivered through an output of a first operational amplifier, wherein the first operational amplifier is connected at a positive input to a first reference voltage source, and wherein the first operational amplifier is connected at a negative input to the source terminal of the first transistor.

5. The circuit arrangement according to claim 1, wherein the second control voltage is delivered through an output of a second operational amplifier, wherein the second operational amplifier is connected at a positive input to a second reference voltage source, and wherein the second operational amplifier is connected at a negative input to the source terminal of the second transistor.

6. The circuit arrangement according to claim 1, wherein a voltage is connected to a control terminal of at least one of the first transistor, the second transistor, or the third transistor, which controls a source terminal to a reference potential.

7. The circuit arrangement according to claim 1, wherein a control terminal of at least one of the first transistor, the second transistor, or the third transistor is connected to an output of an operational amplifier;

wherein a positive input of the operational amplifier is connected to a reference potential, and wherein a negative input of the operational amplifier is connected to a source terminal of at least one of the first transistor, the second transistor, or the third transistor.

* * * * *